US012620888B2

(12) United States Patent
Lin et al.

(10) Patent No.: US 12,620,888 B2
(45) Date of Patent: May 5, 2026

(54) ANALOG FRONTEND CIRCUIT AND SIGNAL FILTERING METHOD FOR PHOTOPLETHYSMOGRAPHY

(71) Applicant: Realtek Semiconductor Corporation, Hsinchu (TW)

(72) Inventors: Chia-Liang Lin, Fremont, CA (US); Yen-Wei Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 377 days.

(21) Appl. No.: 18/422,128

(22) Filed: Jan. 25, 2024

(65) Prior Publication Data

US 2025/0246991 A1 Jul. 31, 2025

(51) Int. Cl.
*H02M 1/096* (2006.01)
*G01R 19/00* (2006.01)
*H03F 3/00* (2006.01)

(52) U.S. Cl.
CPC ........ *H02M 1/096* (2013.01); *G01R 19/0084* (2013.01); *H03F 3/005* (2013.01)

(58) Field of Classification Search
CPC ........ H04B 1/04; H04B 1/0475; H04B 15/04; H04B 1/0483; H04B 1/28; H04B 2001/045; H04B 2001/0491; H04B 1/0003; H04B 1/40; H04B 1/406; H04B 15/02; H04B 2215/064; H04B 14/026; H04B 1/71637; H04B 2001/0416; H04B 1/30; H04B 1/3827; H04B 10/40; H04B 7/0482;

(Continued)

(56) References Cited

U.S. PATENT DOCUMENTS

| | | | |
|---|---|---|---|
| 7,592,792 B2 * | 9/2009 | Ryu | H02M 3/156 |
| | | | 323/284 |
| 7,710,084 B1 * | 5/2010 | Guo | G01R 19/003 |
| | | | 323/283 |

(Continued)

OTHER PUBLICATIONS

Qiuyang Lin et al., "A 119dB Dynamic Range Charge Counting Light-to-Digital Converter For Wearable PPG/NIRS Monitoring Applications", IEEE Transactions on Biomedical Circuits and Systems, vol. 14, No. 4, Aug. 2020, pp. 800-810.

(Continued)

*Primary Examiner* — John W Poos
(74) *Attorney, Agent, or Firm* — McClure, Qualey & Rodack, LLP

(57) ABSTRACT

An analog frontend circuit for photoplethysmography includes a current control circuit and a monitoring circuit both coupled with a first node, and also includes a reading circuit coupled with the first node through the monitoring circuit. The current control circuit generates a first sub-current which is part of an input current flowing to the first node. In a tracking period, the monitoring circuit controls the current control circuit to determine magnitude of the first sub-current to control a voltage of the first node to track a reference voltage. In a sensing period after the tracking period, the monitoring circuit controls the current control circuit to keep the first sub-current determined in the tracking period. After the first sub-current is kept, the monitoring circuit provides a second sub-current which is part of the input current, and the reading circuit converts the second sub-current to an output voltage.

20 Claims, 9 Drawing Sheets

(58) Field of Classification Search
CPC .. H04B 7/0639; H04B 10/541; H04B 1/7183;
H04B 2001/0425; H04B 1/7174; H04B
1/18; H04B 1/385; H04B 1/0017; H04B
2001/0408; H04B 1/00; H04B 1/0007;
H04B 1/001; H04B 1/0028; H04B
1/1027; H04B 1/109; H04B 1/69; H04B
1/7176; H04B 17/309; H04B 7/10; H04B
1/0025; H04B 1/1036; H04B 1/38; H04B
1/48; H04B 1/707; H04B 1/712; H04B
1/7156; H04B 1/71635; H04B 1/719;
H04B 2001/3861; H04B 7/12; H04B
1/0458; H04B 1/10; H04B 1/1081; H04B
1/123; H04B 1/16; H04B 1/403; H04B
1/7163; H04B 1/71632; H04B 1/7172;
H04B 17/21; H04B 2001/1072; H04B
2001/6908; H04B 3/04; H04B 5/73;
H04B 5/77; H04B 5/79; H04B 7/005;
H04B 7/0413; H04B 7/0473; H04B
7/0828; H04B 1/12; H04B 1/405; H04B
10/503; H04B 10/532; H04B 10/564;
H04B 10/695; H04B 10/6971; H04B
14/023; H04B 14/06; H04B 15/00; H04B
17/23; H04B 17/26; H04B 17/29; H04B
17/318; H04B 17/345; H04B 17/40;
H04B 2001/0433; H04B 7/0641; H04B
7/18504; H04L 67/12; H04L 1/004; H04L
27/362; H04L 7/033; H04L 7/0008; H04L
27/20; H04L 27/36; H04L 63/0272; H04L
27/103; H04L 1/0041; H04L 7/0037;
H04L 7/0087; H04L 63/08; H04L 7/0062;
H04L 7/0079; H04L 25/00; H04L 25/49;
H04L 63/029; H04L 7/0091; H04L
7/0331; H04L 25/14; H04L 27/0014;
H04L 27/0002; H04L 63/0227; H04L
63/0876; H04L 67/02; H04L 67/56; H04L
67/59; H04L 25/02; H04L 25/0272; H04L
63/0823; H04L 25/03057; H04L 25/4908;
H04L 67/52; H04L 7/0337; H04L 1/0045;
H04L 1/0057; H04L 12/56; H04L
2001/0094; H04L 25/03885; H04L
25/061; H04L 27/361; H04L 27/366;
H04L 1/0002; H04L 1/0009; H04L
1/0061; H04L 1/18; H04L 12/40; H04L
2012/40267; H04L 2027/0053; H04L
25/0264; H04L 25/0296; H04L 25/03019;
H04L 25/03267; H04L 25/03828; H04L
25/06; H04L 27/0006; H04L 27/0012;
H04L 27/06; H04L 5/0064; H04L 63/14;
H04L 63/1416; H04L 67/1097; H04L
1/0003; H04L 1/0026; H04L 1/189; H04L
1/20; H04L 2025/03579; H04L
2025/03777; H04L 2027/0067; H04L
25/03146; H04L 25/03834; H04L 27/227;
H04L 27/24; H04L 27/2602; H04L
27/2607; H04L 27/26132; H04L 27/2657;
H04L 27/2663; H04L 27/2668; H04L
27/2675; H04L 43/087; H04L 5/0012;
H04L 7/00; H04L 12/10; H04L 12/18;
H04L 12/4633; H04L 12/4641; H04L
12/66; H04L 2209/12; H04L 25/0266;
H04L 25/03891; H04L 25/08; H04L
27/30; H04L 27/367; H04L 27/389; H04L
41/122; H04L 43/045; H04L 47/122;
H04L 5/14; H04L 63/0236; H04L 63/10;
H04L 63/102; H04L 63/1408; H04L
63/1425; H04L 63/145; H04L 69/00;
H04L 69/16; H04L 69/18; H04L 9/0866;
H04L 9/0869; H04L 1/00; H04L 1/0029;
H04L 1/1874; H04L 2025/03426; H04L
2027/0063; H04L 2203/02; H04L
2209/805; H04L 25/0202; H04L 25/0214;
H04L 25/0224; H04L 25/03312; H04L
25/03343; H04L 25/03949; H04L 25/085;
H04L 25/4902; H04L 25/4917; H04L
27/00; H04L 27/0008; H04L 27/01; H04L
27/02; H04L 27/12; H04L 27/14; H04L
27/148; H04L 27/156; H04L 27/2626;
H04L 27/2672; H04L 27/3411; H04L
27/368; H04L 27/3854; H04L 27/3881;
H04L 49/10; H04L 67/025; H04L 67/306;
H04L 67/562; H04L 67/566; H04L 69/28;
H04L 7/0012; H04L 7/0058; H04L 7/046;
H04L 9/3239; H04L 9/50; H03M 1/1245;
H03M 1/1215; H03M 1/1009; H03M
1/002; H03M 1/12; H03M 1/121; H03M
1/46; H03M 1/468; H03M 1/0614; H03M
1/0881; H03M 1/126; H03M 1/164;
H03M 1/1225; H03M 1/1033; H03M
1/38; H03M 1/1004; H03M 1/44; H03M
1/365; H03M 1/0641; H03M 1/1014;
H03M 1/1061; H03M 1/14; H03M 1/167;
H03M 1/001; H03M 1/06; H03M 1/0639;
H03M 1/1019; H03M 1/145; H03M
3/454; H03M 1/0617; H03M 1/1028;
H03M 1/1095; H03M 1/1205; H03M
1/124; H03M 1/129; H03M 1/462; H03M
1/56; H03M 1/069; H03M 1/1023; H03M
1/742; H03M 3/43; H03M 1/128; H03M
1/168; H03M 1/54; H03M 1/785; H03M
3/37; H03M 3/382; H03M 3/498; H03M
1/0607; H03M 1/0609; H03M 1/186;
H03M 1/201; H03M 1/361; H03M 1/50;
H03M 3/402; H03M 7/3062; H03M
1/004; H03M 1/007; H03M 1/0626;
H03M 1/1038; H03M 1/109; H03M
1/123; H03M 1/1255; H03M 1/146;
H03M 1/16; H03M 1/466; H03M 1/60;
H03M 1/66; H03M 3/30; H03M 3/344;
H03M 3/424; H03M 3/434; H03M 3/456;
H03M 3/464; H03M 1/0612; H03M
1/066; H03M 1/08; H03M 1/0818; H03M
1/18; H03M 1/181; H03M 1/188; H03M
1/34; H03M 1/36; H03M 1/662; H03M
1/74; H03M 3/358; H03M 3/372; H03M
3/374; H03M 3/412; H03M 3/46; H03M
3/47; H03M 7/165; H03M 9/00; H03M
1/005; H03M 1/0604; H03M 1/0678;
H03M 1/0682; H03M 1/0687; H03M
1/0695; H03M 1/0836; H03M 1/0845;
H03M 1/0863; H03M 1/10; H03M
1/1071; H03M 1/122; H03M 1/20; H03M
1/362; H03M 1/504; H03M 1/765; H03M
1/804; H03M 1/82; H03M 11/02; H03M
11/10; H03M 3/38; H03M 3/386; H03M
3/388; H03M 3/392; H03M 3/398; H03M
3/40; H03M 3/414; H03M 3/474; H03M
3/48; H03M 3/488; H03M 5/02; H03M
1/00; H03M 1/0624; H03M 1/0872;
H03M 1/089; H03M 1/1057; H03M 1/125; H03M 1/144; H03M 1/367; H03M
1/368; H03M 1/40; H03M 1/403; H03M
1/485; H03M 1/502; H03M 1/52; H03M
1/68; H03M 13/27; H03M 13/2789;
H03M 13/6508; H03M 3/34; H03M 3/39;
H03M 3/426; H03M 3/452; H03M 3/458;
H03M 3/494; H03M 3/496; H03F 3/211;
H03F 2200/451; H03F 3/245; H03F
2200/336; H03F 2200/387; H03F 1/0261;
H03F 3/195; H03F 3/72; H03F 1/0227;
H03F 1/0277; H03F 2203/21142; H03F
2200/411; H03F 2200/504; H03F
2203/21106; H03F 2200/414; H03F
2200/537; H03F 2200/171; H03F 3/24;
H03F 3/45475; H03F 3/602; H03F
2200/222; H03F 2200/318; H03F
2200/534; H03F 1/0294; H03F 2200/27;
H03F 2200/417; H03F 2203/21157; H03F
2200/541; H03F 1/32; H03F 1/0205;
H03F 3/193; H03F 1/02; H03F 3/45071;
H03F 1/3205; H03F 1/3223; H03F
1/0233; H03F 2201/3215; H03F 3/19;
H03F 3/45183; H03F 3/68; H03F 1/3211;
H03F 1/3241; H03F 3/38; H03F 1/0211;
H03F 1/30; H03F 3/21; H03F 1/301;
H03F 2200/102; H03F 2200/18; H03F
2200/261; H03F 3/191; H03F 3/45179;
H03F 2200/331; H03F 2201/3206; H03F
3/45188; H03F 1/26; H03F 2200/129;
H03F 3/08; H03F 1/34; H03F 2200/294;
H03F 2200/447; H03F 2203/45116; H03F
3/005; H03F 1/0222; H03F 2200/351;
H03F 2203/45156; H03F 2203/45526;
H03F 3/393; H03F 1/0216; H03F 1/223;
H03F 2200/111; H03F 2200/156; H03F
2200/408; H03F 2203/45394; H03F
2203/45514; H03F 2203/45616; H03F
3/087; H03F 1/083; H03F 1/523; H03F
2200/165; H03F 2200/271; H03F
2200/372; H03F 2200/453; H03F
2200/78; H03F 2203/45246; H03F
2203/45396; H03F 2203/45424; H03F
2203/45692; H03F 3/187; H03F 3/2175;
H03F 3/3022; H03F 3/45632; H03F
3/45928; H03F 3/505; H03F 1/0266;
H03F 1/0272; H03F 1/14; H03F 1/303;
H03F 2200/153; H03F 2200/321; H03F
2200/75; H03F 2203/45024; H03F
2203/45052; H03F 2203/45101; H03F
2203/45138; H03F 2203/45302; H03F
2203/45306; H03F 2203/45318; H03F
2203/45512; H03F 2203/45528; H03F
2203/45702; H03F 3/04; H03F 1/304;
H03F 1/342; H03F 1/52; H03F 1/56;
H03F 2200/03; H03F 2203/45136; H03F
2203/45506; H03F 2203/45551; H03F
2203/7206; H03F 2203/7209; H03F
3/183; H03F 3/217; H03F 3/2171; H03F
3/2173; H03F 3/3023; H03F 3/45242;
H03F 3/45273; H03F 3/45968; H03F
1/3247; H03F 1/565; H03F 2200/105;
H03F 2200/15; H03F 2200/207; H03F
2200/228; H03F 2200/231; H03F
2200/345; H03F 2200/99; H03F
2203/30036; H03F 2203/30084; H03F 2203/30117; H03F 2203/45022; H03F
2203/45044; H03F 2203/45048; H03F
2203/45151; H03F 2203/45296; H03F
2203/45298; H03F 2203/45332; H03F
2203/45361; H03F 2203/45362; H03F
2203/45374; H03F 2203/45466; H03F
2203/45492; H03F 2203/45618; H03F
2203/45644; H03F 2203/7221; H03F
2203/7236; H03F 3/00; H03F 3/082;
H03F 3/16; H03F 3/1935; H03F 3/213;
H03F 3/26; H03F 3/301; H03F 3/4508;
H03F 3/45089; H03F 3/45098; H03F
3/45165; H03F 3/45174; H03F 3/45192;
H03F 3/45197; H03F 3/45206; H03F
3/45264; H03F 3/45659; H03F 3/45708;
H03F 3/45744; H03F 3/45775; H03F
3/601; H03F 3/604; H03F 3/70; H03F
1/08; H03F 1/086; H03F 1/12; H03F
1/22; H03F 1/3294; H03F 1/42; H03F
2200/168; H03F 2200/249; H03F
2200/252; H03F 2200/264; H03F
2200/267; H03F 2200/297; H03F
2200/303; H03F 2200/375; H03F
2200/381; H03F 2200/421; H03F
2200/426; H03F 2200/429; H03F
2200/456; H03F 2200/462; H03F
2200/468; H03F 2200/471; H03F
2200/555; H03F 2201/3233; H03F
2203/21145; H03F 2203/21175; H03F
2203/45032; H03F 2203/45134; H03F
2203/45174; H03F 2203/45178; H03F
2203/45191; H03F 2203/45221; H03F
2203/45258; H03F 2203/45286; H03F
2203/45348; H03F 2203/45366; H03F
2203/45588; H03F 2203/45592; H03F
2203/45614; H03F 2203/45628; H03F
2203/45632; H03F 2203/45686; H03F
2203/45688; H03F 2203/45701; H03F
2203/45726; H03F 2203/5012; H03F
2203/5018; H03F 2203/5021; H03F
2203/5024; H03F 2203/5031; H03F
3/189; H03F 3/45237; H03F 3/45246;
H03F 3/4565; H03F 3/45695; H03F
3/45941; H03F 3/45973; H03F 3/45977;
H03F 3/45995; H02M 1/096; H02M
1/0006; H02M 1/0009; H02M 1/08;
G01R 19/0084; A61B 5/14551; A61B
5/02427; A61B 5/14552; A61B 5/72
See application file for complete search history.

(56)                References Cited

U.S. PATENT DOCUMENTS

| | | | | |
|---|---|---|---|---|
| 10,056,835 | B2* | 8/2018 | Eggermont | H02M 1/08 |
| 2010/0085025 | A1* | 4/2010 | Kato | H02M 3/157 |
| | | | | 323/282 |
| 2015/0280544 | A1* | 10/2015 | Wang | H02M 1/32 |
| | | | | 323/285 |
| 2017/0346385 | A1* | 11/2017 | Liang | H02M 3/158 |
| 2018/0115310 | A1* | 4/2018 | Horiguchi | H03K 17/166 |

(56)          References Cited

OTHER PUBLICATIONS

Yun-Shiang Shu et al., "A 4.5mm2 Multimodal Biosensing SoC for PPG, ECG, BIOZ and GSR Acquisition in Consumer Wearable Devices", 2020 IEEE International Solid-State Circuits Conference, pp. 400-401.

Luca Sant et al., "A 13.2 b Optical Proximity Sensor System With 130 klx Ambient Light Rejection Capable of Heart Rate and Blood Oximetry Monitoring", IEEE Journal of Solid-State Circuits, vol. 51, No. 7, Jul. 2016, pp. 1674-1683.

Jiawei Xu et al., "A 36 μW 1.1 mm2 Reconfigurable Analog Front-End for Cardiovascular and Respiratory Signals Recording", IEEE Transactions on Biomedical Circuits and Systems, vol. 12, No. 4, Aug. 2018, pp. 774-783.

Eric S. Winokur et al., "A Low-Power, Dual-Wavelength Photoplethysmogram (PPG) SoC With Static and Time-Varying Interferer Removal", IEEE Transactions on Biomedical Circuits and Systems, vol. 9, No. 4, Aug. 2015, pp. 581-589.

Shuang Song et al., "A 769 μW Battery-Powered Single-Chip SoC With BLE for Multi-Modal Vital Sign Monitoring Health Patches", IEEE Transactions on Biomedical Circuits and Systems, vol. 13, No. 6, Dec. 2019, pp. 1506-1517.

Ajit Sharma et al., "A Sub-60-μA Multimodal Smart Biosensing SoC With >80-dB SNR, 35-μA Photoplethysmography Signal Chain", IEEE Journal of Solid-State Circuits, vol. 52, No. 4, Apr. 2017, pp. 1021-1033.

Fatemeh Marefat et al., "A 280 μW, 108 dB DR PPG-Readout IC With Reconfigurable, 2nd-Order, Incremental $\Delta\Sigma$M Front-End for Direct Light-to-Digital Conversion", IEEE Transactions on Biomedical Circuits and Systems, vol. 14, No. 6, Dec. 2020, pp. 1183-1194.

Mohamed Atef et al., "A Fully Integrated High-Sensitivity Wide Dynamic Range PPG Sensor With an Integrated Photodiode and an Automatic Dimming Control LED Driver", IEEE Sensors Journal, vol. 18, No. 2, Jan. 15, 2018, pp. 652-659.

* cited by examiner

300

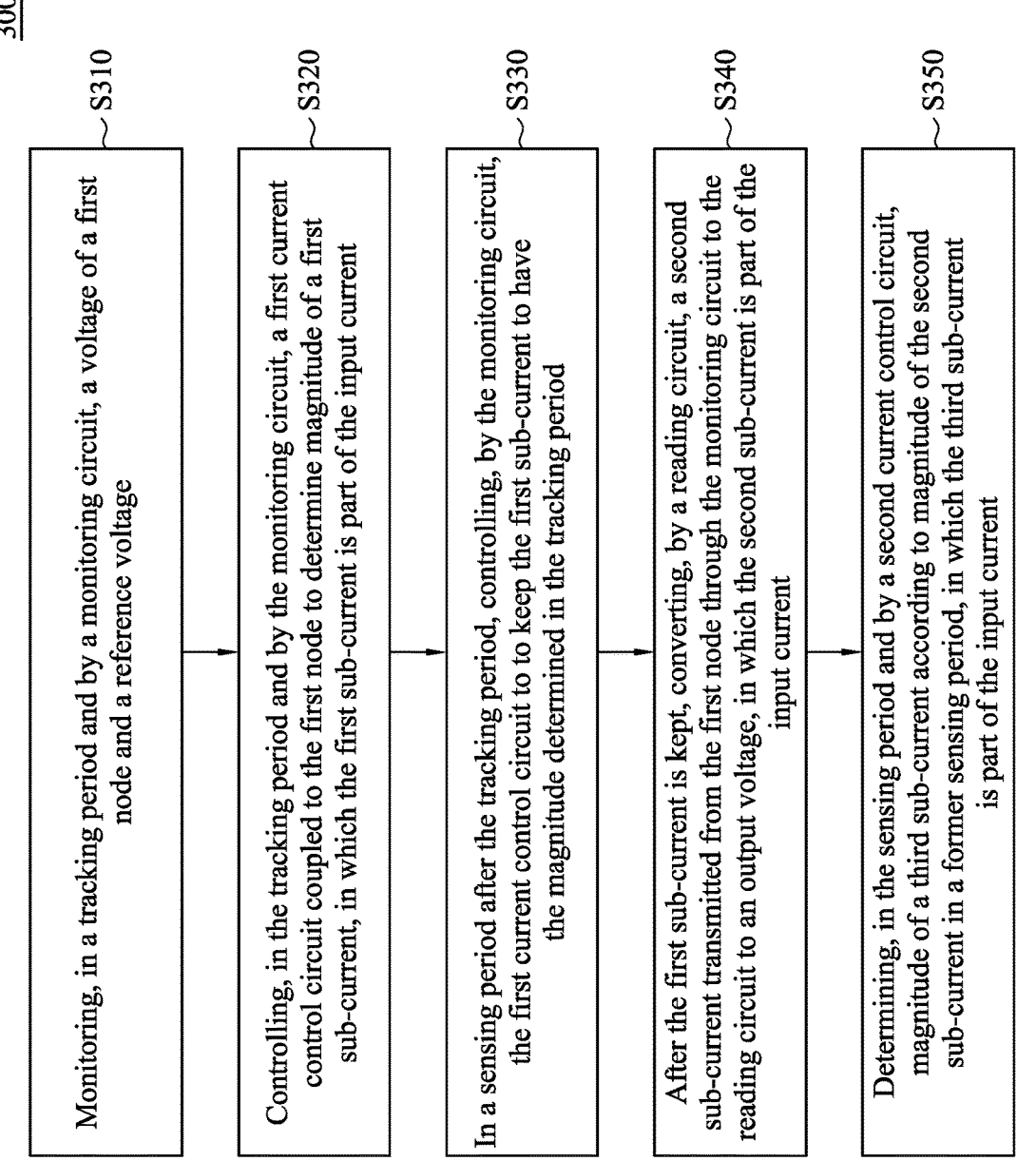

S310

Monitoring, in a tracking period and by a monitoring circuit, a voltage of a first node and a reference voltage

S320

Controlling, in the tracking period and by the monitoring circuit, a first current control circuit coupled to the first node to determine magnitude of a first sub-current, in which the first sub-current is part of the input current

S330

In a sensing period after the tracking period, controlling, by the monitoring circuit, the first current control circuit to to keep the first sub-current to have the magnitude determined in the tracking period

S340

After the first sub-current is kept, converting, by a reading circuit, a second sub-current transmitted from the first node through the monitoring circuit to the reading circuit to an output voltage, in which the second sub-current is part of the input current

S350

Determining, in the sensing period and by a second current control circuit, magnitude of a third sub-current according to magnitude of the second sub-current in a former sensing period, in which the third sub-current is part of the input current

Fig. 3

ANALOG FRONTEND CIRCUIT AND SIGNAL FILTERING METHOD FOR PHOTOPLETHYSMOGRAPHY

BACKGROUND

Technical Field

The present disclosure relates to photoplethysmography. More particularly, the present disclosure relates to an analog front end circuit and a signal filtering method for photoplethysmography.

Description of Related Art

Photoplethysmography (PPG) is an optical method to measure heart rate and blood oxygen saturation. In PPG, light-emitting diodes (LEDs) emit light toward skin of a user, and the light reflect by blood and human tissue of the user is measured and transformed to a current signal by an optical sensor. However, a DC component of the current signal may be dominated by slowly-changed ambient light (e.g., light from a light bulb), and an AC component of the current signal may be dominated by fast-changed ambient light (e.g., light change caused by activities of the user). To improve accuracy of PPG, the components of the current signal that are caused by the ambient light should be filtered out, so as to facilitate analysis of a back-end circuit to the AC component and DC component of the current signal that are related to the blood and the human tissue.

SUMMARY

The present disclosure provides an analog frontend circuit for photoplethysmography, which includes a first current control circuit, a monitoring circuit and a reading circuit. The first current control circuit is coupled with a first node, and configured to generate a first sub-current. The first sub-current is part of an input current flowing to the first node. The monitoring circuit is coupled with the first node, and is configured to receive a reference voltage. In a tracking period, the monitoring circuit is configured to control the first current control circuit to determine magnitude of the first sub-current, in order to control a voltage of the first node to track the reference voltage. The reading circuit is coupled with the first node through the monitoring circuit. In a sensing period after the tracking period, the monitoring circuit is configured to control the first current control circuit to keep the first sub-current to have the magnitude of the first sub-current determined in the tracking period. After the first sub-current is kept, the monitoring circuit is configured to transmit a second sub-current from the first node to the reading circuit so that the reading circuit is configured to convert the second sub-current to an output voltage. The second sub-current is part of the input current.

The present disclosure provides a signal filtering method for photoplethysmography. The signal filtering method includes the following steps: monitoring, in a tracking period and by a monitoring circuit, a voltage of a first node and a reference voltage, wherein an input current flows to the first node; controlling, in the tracking period and by the monitoring circuit, a first current control circuit coupled to the first node to determine magnitude of a first sub-current, in which the first sub-current is part of the input current and generated by the first current control circuit; in a sensing period after the tracking period, controlling, by the monitoring circuit, the first current control circuit to keep the first sub-current to have the magnitude of the first sub-current determined in the tracking period; and after the first sub-current is kept, converting, by a reading circuit coupled with the first node through the monitoring circuit, a second sub-current transmitted from the first node through the monitoring circuit to the reading circuit to an output voltage, in which the second sub-current is part of the input current.

It is to be understood that both the foregoing general description and the following detailed description are by examples, and are intended to provide further explanation of the disclosure as claimed.

BRIEF DESCRIPTION OF THE DRAWINGS

FIG. 3 is a flowchart of a signal filtering method for photoplethysmography.

DETAILED DESCRIPTION

Figure 1:
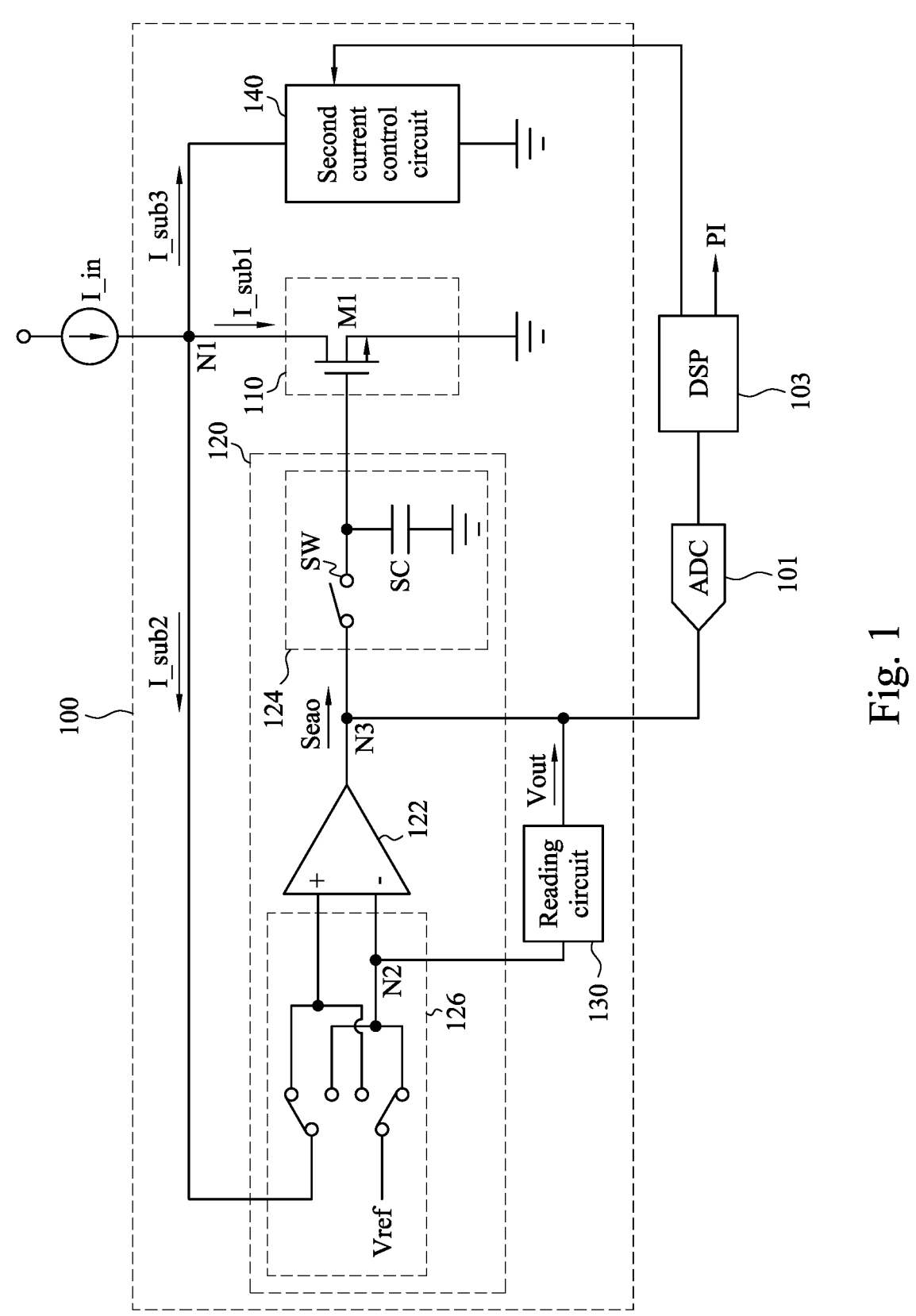
FIG. 1 is a simplified functional block diagram of an analog frontend circuit for photoplethysmography, according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of an analog frontend circuit 100 for photoplethysmography (PPG), according to one embodiment of the present disclosure. The analog frontend circuit 100 comprises a first current control circuit 110, a monitoring circuit 120, a reading circuit 130 and a second current control circuit 140. The analog frontend circuit 100 is configured to convert an input current I_in to an output voltage Vout, in which the input current I_in is generated by an optical sensor (not shown) through transforming absorbed light to a current signal. An analog-to digital converter (ADC) 101 is configured to convert the output voltage Vout, where a digital signal processor (DSP) 103 is configured to receive and analyze an output of the ADC 101 to obtain physiological information PI (e.g., heart rate, blood oxygen saturation, etc.,) of a user. The DSP 103 is further configured to realize a feedback control to the analog frontend circuit 100 based on the analysis to the output of the ADC 101, which will be described in greater detail in the following paragraphs.

Figure 2:
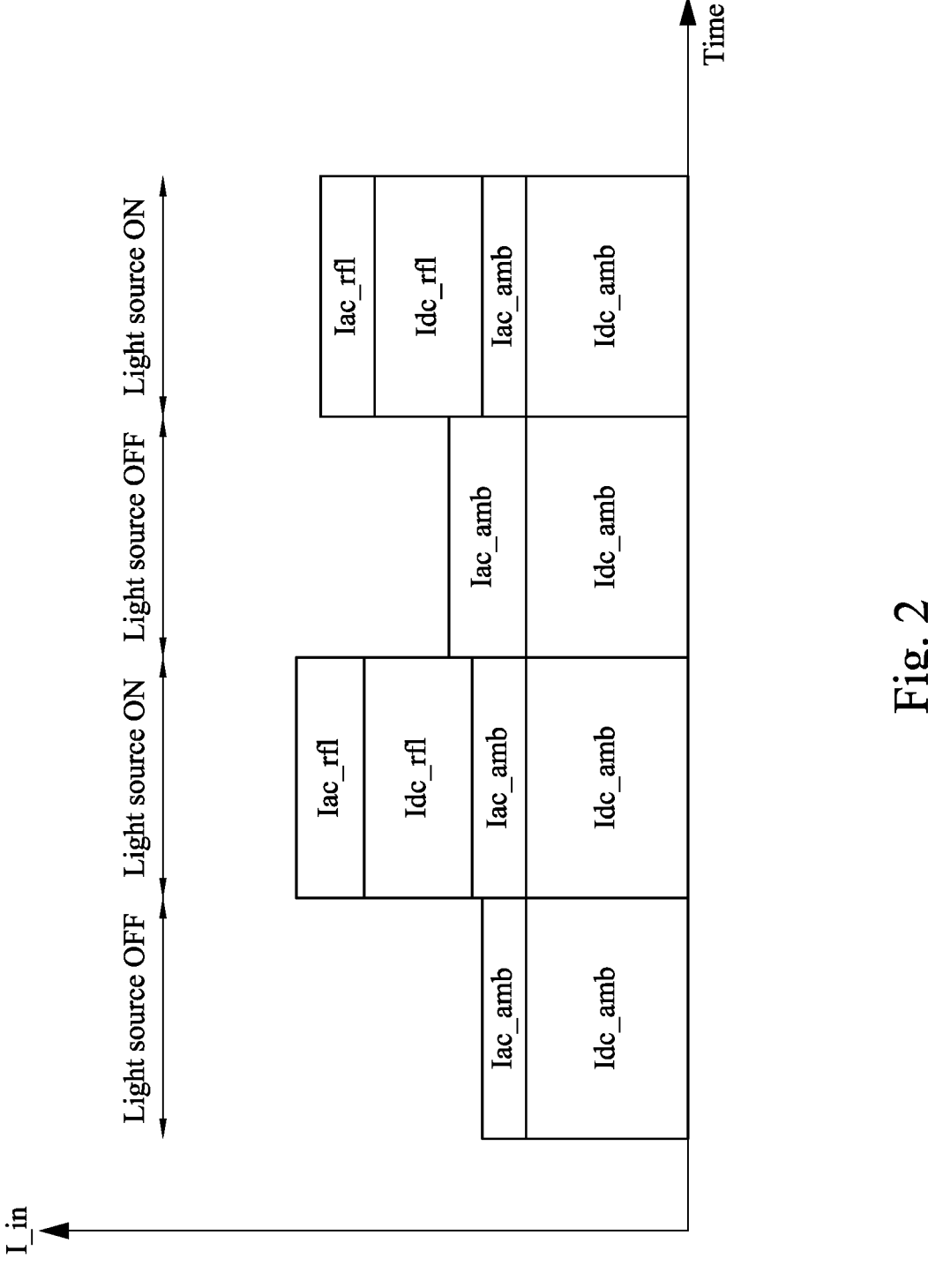
FIG. 2 is a schematic diagram of the input current according to one embodiment of the present disclosure.

Reference is made to FIG. 2, in which FIG. 2 is a schematic diagram of the input current I_in according to one embodiment of the present disclosure. When a light source (e.g., an LED, not shown in FIG. 1) of PPG is disabled and no light is reflected from the user, the input current I_in comprises an ambient AC component Iac_amb and an ambient DC component Idc_amb that respectively caused by fast-changed ambient light and slowly-changed ambient light absorbed by the optical sensor. In addition, when the light source of PPG is enabled and there is light reflected by blood and/or tissue of the user to the optical sensor, except for the ambient AC component Iac_amb and the ambient DC component Idc_amb, the input current I_in further comprises a reflected AC component Iac_rfl and a reflected DC component Idc_rfl. The reflected AC component Iac_rfl may be caused by the light reflected by the blood, subcutis or bones of the user that are dynamically changed (i.e., time-variant). The reflected DC component Idc_rfl may be caused by the light reflected by the blood, subcutis or bones of the user that remain static (i.e., time-invariant).

Reference is made to FIG. 1 and FIG. 3, in which FIG. 3 is a flowchart of a signal filtering method 300 for PPG. In step S310 conducted in a tracking period, the monitoring circuit 120, which is coupled with a first node N1 and is configured to receive a reference voltage Vref, monitors a voltage of the first node N1 and the reference voltage Vref, where the input current I_in flows to the first node N1. The tracking period is a period where the light source of PPG is disabled, and therefore, the input current I_in in the tracking period comprises only the ambient AC component Iac_amb and the ambient DC component Idc_amb.

In step S320 conducted in the tracking period, the monitoring circuit 120 controls the first current control circuit 110 to determine a magnitude of a first sub-current I_sub1, in order to configure the voltage of the first node N1 to track the reference voltage Vref. The first current control circuit 110 is coupled with the first node N1, and is configured to generate the first sub-current I_sub1, where the first sub-current I_sub1 is part of the input current I_in flowing to the first node N1. In specific, in the tracking period, the monitoring circuit 120 sets the voltage of the first node N1 to the reference voltage Vref by virtual short effect of an amplifier 122, and uses a control signal Seao to dynamically control the first current control circuit 110 to drain most of the input current I_in as the first sub-current I_sub1, where the control signal Seao is generated by the monitoring circuit 120 according to the voltage of the first node N1 and the reference voltage Vref. As a result, a second sub-current I_sub2, which flows from the first node N1 to the monitoring circuit 120 and is part of the input current I_in, is small and hardly changes the voltage of the first node N1 so that the voltage of the first node N1 remains at the reference voltage Vref. Alternatively stated, the first current control circuit 110 and the monitoring circuit 120 form a tracking loop that continuously tracks the change of the ambient light. The change of the ambient light causes the monitor circuit 120 to control the first current control circuit 110 to adjust the first sub-current I_sub1, so that the first sub-current I_sub1 varies with the ambient light. Thus, the first sub-current I_sub1 is approximated to a sum of the ambient AC component Iac_amb and the ambient DC component Idc_amb, and the second sub-current I_sub2 is substantially zero.

In step S330 conducted in a sensing period after the tracking period, the monitoring circuit 120 controls the first current control circuit 110 to keep the first sub-current I_sub1 to have the magnitude determined in the tracking period. The sensing period is a period where the light source of PPG is enabled, and therefore, the input current I_in in the sensing period comprises the ambient AC component Iac_amb, the ambient DC component Idc_amb, the reflected AC component Iac_rfl and the reflected DC component Idc_rfl.

In step S340 conducted after the first sub-current I_sub1 is kept at the fixed magnitude, the reading circuit 130 is configured to convert the second sub-current I_sub2 to the output voltage Vout. The reading circuit 130 is coupled with the first node N1 through the monitoring circuit 120, and the second sub-current I_sub2 is part of the input current I_in. The second sub-current I_sub2 is transmitted from the first node N1 through (e.g., by) the monitoring circuit 120 to the reading circuit 130.

In step S350, the second current control circuit 140 coupled with the first node N1 is configured to generate a third sub-current I_sub3 in the sensing period. The second current control circuit 140 is further configured to determine a magnitude of the third sub-current I_sub3 according to a magnitude of the second sub-current I_sub2 in a former sensing period, which will be described in greater detail in the following paragraphs. The third sub-current I_sub3 is configured by the feedback control of the DSP 103 to approximate to the reflected DC component Idc_rfl, and is part of the input current I_in.

Accordingly, the ambient DC component Idc_amb is filtered out by the first current control circuit 110 through the first sub-current I_sub1, and the reflected DC component Idc_rfl is filtered out by the second current control circuit 140 through the third sub-current I_sub3. The second sub-current I_sub2 is approximated to the combination of the ambient AC component Iac_amb and the reflected AC component Iac_refl. Since the second sub-current I_sub2 is small, the reading circuit 130 may be implemented as having a large gain (e.g., selecting resistors with large resistance to form a storage array in FIG. 5) when converting the second sub-current I_sub2 to the output voltage Vout, without a risk that the output voltage Vout exceeds a dynamic range of the ADC 101.

The details of step S310 are described below. The monitoring circuit 120 comprises the amplifier 122, a sample-and-hold circuit 124 and a switch array 126 which cooperatively conduct step S310. The amplifier 122 comprises a first input terminal (e.g., a non-inverted input terminal), a second input terminal (e.g., an inverted input terminal, labeled as a second node N2) and an output terminal (labeled as a third node N3). The second input terminal of the amplifier 122 is coupled with the reading circuit 130. In some embodiments, the amplifier 122 may be implemented by using an operational amplifier (OPAMP) or an operational transconductance amplifier (OTA).

The sample-and-hold circuit 124 is coupled with the output terminal of the amplifier 122. The sample-and-hold circuit 124 is configured to sample an output of the amplifier 122 (labeled as the control signal Seao), and further configured to output the sampled output of the amplifier 122 to the first current control circuit 110, so as to control the first current control circuit 110 to determine the magnitude of the first sub-current I_sub1. In specific, the sample-and-hold circuit 124 comprises a sampling switch SW and a sampling capacitor SC. The sampling capacitor SC comprises a first terminal and a second terminal, where the first terminal of the sampling capacitor SC is coupled with the first current control circuit 110, and the second terminal of the sampling capacitor SC is configured to receive a first operation voltage (e.g., the ground voltage). The sampling switch SW is coupled between the output terminal of the amplifier 122 and the first terminal of the sampling capacitor SC. The sampling switch SW is conducted in the tracking period so that the sampling capacitor SC samples the control signal Seao. On other hand, the sampling switch SW is switched off in the sensing period so that the sampling capacitor SC holds the sampled control signal Seao.

The switch array 126 is coupled with the first node, the first input terminal and the second input terminal of the amplifier 122, and is configured to receive the reference voltage Vref. In some embodiments, the switch array 126 may be implemented by using two single-pole double-throw (SPDT) switches. In the tracking period, the switch array 126 is configured to connect the first node N1 to the first input terminal of the amplifier 122 to provide the second sub-current I_sub2 to the first input terminal of the amplifier 122. The switch array 126 is further configured to provide the reference voltage Vref to the second input terminal of the amplifier 122 in the tracking period. Therefore, the amplifier 122 sets the first node N1 to the reference voltage Vref in the tracking period by the virtual short effect between the first input terminal and the second input terminal of the amplifier 122. The control signal Seao reflects divergence between the voltage of the first node N1 and the reference voltage Vref. For example, the control signal Seao may have a high voltage when the voltage of the first node N1 is different from and higher than the reference voltage Vref, and have a low voltage when the voltage of the first node N1 is different from and lower than the reference voltage Vref, but this disclosure is not limited thereto.

Accordingly, step S310 conducted in the tracking period comprises: receiving the second sub-current I_sub2 and the reference voltage Vref by the switch array 126; and transmitting the second sub-current I_sub2 and the reference voltage Vref respectively to the first input terminal and the second input terminal of the amplifier 122.

The details of step S320 are described below. The monitoring circuit 120 and the first current control circuit 110 are configured to cooperatively conduct step S320. The first current control circuit 110 comprises a transistor M1. The transistor M1 comprises a first terminal, a second terminal and a control terminal, and the first sub current I_sub1 flows through the transistor M1. The first terminal of the transistor M1 is coupled with the first node N1. The second terminal of the transistor M1 is configured to receive the first operation voltage (e.g., the ground voltage). The control terminal of the transistor M1 is coupled with the monitoring circuit 120 (i.e., the first terminal of the sampling capacitor CA) to receive the control signal Seao generated by the monitoring circuit 120 according to the voltage of the first node N1 and the reference voltage Vref.

As aforementioned, the sampling switch SW is conducted in the tracking period. Therefore, the sampling capacitor SC samples the output of the amplifier 122 (i.e., the control signal Seao), and outputs the sampled output of the amplifier 122 to the control terminal of the transistor M1, so that the transistor M1 dynamically determines the magnitude of the first sub-current I_sub1 according to the output of the amplifier 122.

Accordingly, step S320 conducted in the tracking period comprises: sampling the output of the amplifier 122 by the sample-and-hold circuit 124 coupled with the output terminal of the amplifier 122 and the first current control circuit 110; and outputting, by the sample-and-hold circuit 124, the sampled output of the amplifier 122 to the first current control circuit 110, so as to control the first current control circuit 110 to determine the magnitude of the first sub-current I_sub1. Viewed from another perspective, the step S320 comprises: generating the control signal Seao by the monitoring circuit 120 according to the voltage of the first node N1 and the reference voltage Vref; and using the transistor M1 of the first current control circuit 110 to determine the magnitude of the first sub-current I_sub1 according to the control signal Seao.

The details of step S330 are described below. In the sensing period after the tracking period, the switch array 126 is configured to connect the first node N1 to the second input terminal of the amplifier 122 to provide the second sub-current I_sub2 to the second input terminal of the amplifier 122, and therefore, the second sub-current I_sub2 is also provided to the reading circuit 130. The switch array 126 is further configured to provide the reference voltage Vref to the first input terminal of the amplifier 122 in the sensing period. In addition, the sampling switch SW of the sample-and-hold circuit 124 is switched off, so that the sampling capacitor SC keeps the output of the amplifier 122 (i.e., the control signal Seao) sampled in the tracking period. As a result, the first terminal of the sampling capacitor SC outputs a fixed voltage to the control terminal of the transistor M1, so as to control the transistor M1 to keep the first sub-current I_sub1 at the magnitude determined in the tracking period.

Accordingly, step S330 conducted in the sensing period comprises: switching off the sampling switch SW of the sample-and-hold circuit 124; and outputting the sampled output of the amplifier 122, by the first terminal of the sampling capacitor SC of the sample-and-hold circuit 124, to the first current control circuit 110 to control the first current control circuit 110 to keep the first sub-current I_sub1 to have the magnitude determined in the tracking period.

Figure 4:
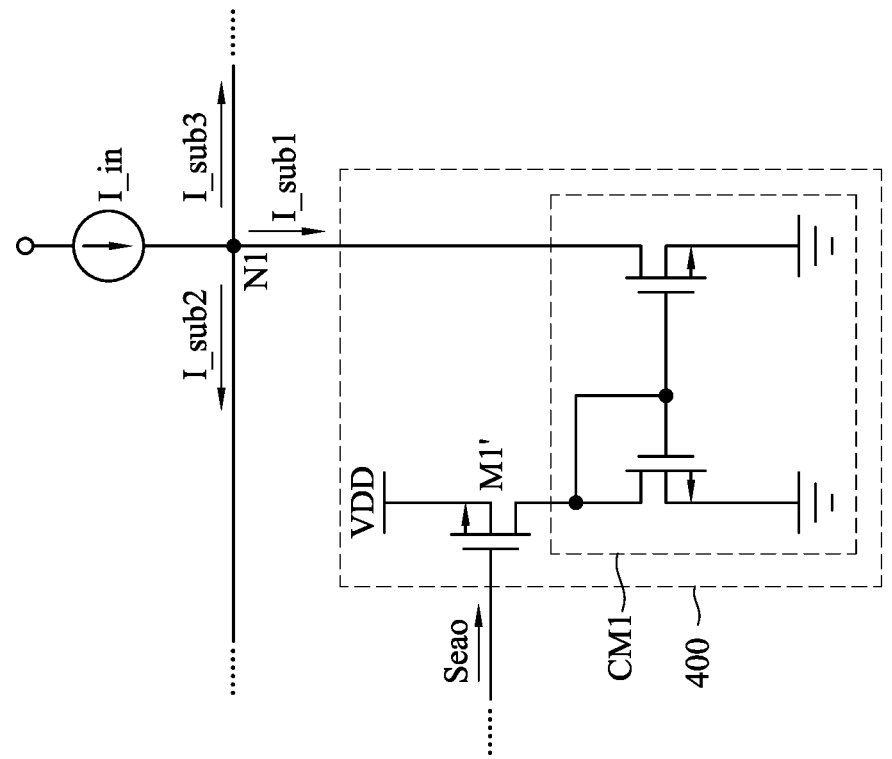
FIG. 4 is a schematic diagram of a first current control circuit according to one embodiment of the present disclosure.

Reference is made to FIG. 4, in which FIG. 4 is a schematic diagram of a first current control circuit 400 according to one embodiment of the present disclosure. In some embodiments, the first current control circuit 110 in FIG. 1 may be replaced with the first current control circuit 400 of FIG. 4. The first current control circuit 400 comprises a transistor M1' and a first current mirror CM1. The transistor M1' comprises a first terminal, a second terminal and a control terminal. The first terminal of the transistor M1' is configured to receive a second operation voltage (e.g., a high voltage VDD), and the second operation voltage is higher than the first operation voltage (e.g., the ground voltage). The control terminal of the transistor M1' is coupled with the monitoring circuit 120 to receive the control signal Seao generated by the monitoring circuit 120 according to the voltage of the first node N1 and the reference voltage Vref. Specifically, the control terminal of the transistor M1' is coupled with the first terminal of the sampling capacitor SC of the sample-and-hold circuit 124.

The first current mirror CM1 comprises an input terminal and an output terminal. The input terminal of the first current mirror CM1 is coupled with the second terminal of the transistor M1'. The output terminal of the first current mirror CM1 is coupled with the first node N1, and the first sub-current I_sub1 flows through the output terminal of the first current mirror CM1. The output of the amplifier 122 (i.e., the control signal Seao) controls a conduction degree of the transistor M1', so as to use a current which is generated by the transistor M1' and flows to the input terminal of the first current mirror CM1 to control the first current mirror CM1 to determine the magnitude of the first sub-current I_sub1.

Accordingly, in the embodiments that the first current control circuit 110 is replaced by the first current control circuit 400, step S320 conducted in the tracking period comprises: generating the control signal Seao by the monitoring circuit 120 according to the voltage of the first node N1 and the reference voltage Vref; receiving the control signal Seao by the control terminal of the transistor M1' of the first current control circuit 400; and using the first current mirror CM1 of the first current control circuit 400 to determine the magnitude of the first sub-current I_sub1. In the embodiments regarding the first current control circuit 400, steps S310, S330 and S340 are similar to those discussed with the first current control circuit 110, and therefore the detailed descriptions thereof are omitted here.

Figure 5:
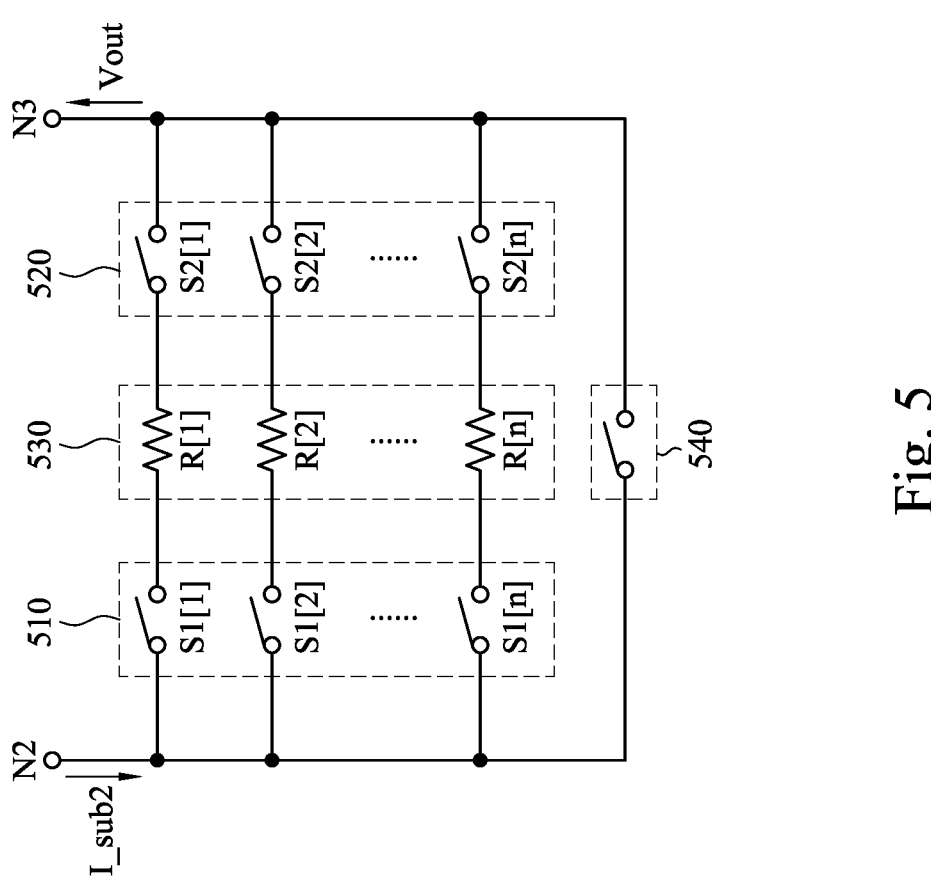
FIG. 5 is a schematic diagram of a reading circuit according to one embodiment of the present disclosure.

The details of step S340 are described below. Reference is made to FIG. 5, in which FIG. 5 is a schematic diagram of a reading circuit 500 according to one embodiment of the present disclosure. The reading circuit 500 of FIG. 5 may be used to realize the reading circuit 130 of FIG. 1. The reading circuit 500 comprises a first switching circuit 510, a second switching circuit 520 and a storage array 530. The first switching circuit 510 comprises first switches S1[1]-S1[$n$] and is coupled between the second node N2 and the storage array 530, where n is a positive integer. The second switching circuit 520 comprises second switches S2[1]-S2[$n$] and is coupled between the third node N3 and the storage array 530. The storage array 530 comprises resistors R[1]-R[n] coupled in parallel between the first switching circuit 510 and the second switching circuit 520. In specific, first terminals of the resistors R[1]-R[n] are coupled with the second node N2 (i.e., the second input terminal of the amplifier 122) through the first switches S1[1]-S1[$n$], respectively. Second terminals of the resistors R[1]-R[n] are coupled with the third node N3 (i.e., the output terminal of the amplifier 122) through the second switches S2[1]-S2[$n$], respectively. That is, the storage array 530 is coupled with the second input terminal of the amplifier 122 through the first switching circuit 510, and is coupled with the output terminal of the amplifier 122 through the second switch circuit 520.

The first switches S1[1]-S1[$n$] and the second switches S2[1]-S2[$n$] are switched off in the tracking period, and are conducted in the sensing period. In the sensing period, when the second sub-current I_sub2 flows from the second node N2 through the resistors R[1]-R[n] to the third node N3, the output voltage Vout is generated at the third node N3 (i.e., the output terminal of the amplifier 122). In some embodiments, the reading circuit 500 further comprises a reset circuit 540, where the reset circuit 540 may short the second node N2 to the third node N3 to reset the output voltage Vout.

In some embodiments, one or more of the resistors R[1]-R[n] may be replaced with one or more capacitors, respectively, to realize an integrator. In some embodiments, the first switches S1[1]-S1[$n$] or the second switches S2[1]-S2[$n$] may be omitted, that is, the reading circuit 130 may comprise at least one switching circuit and the storage array 530, where the at least one switching circuit and the storage array 530 are coupled between the second input terminal of the amplifier 122 and the output terminal of the amplifier 122, and the at least one switching circuit is switched off in the tracking period and conducted in the sensing period. Accordingly, in the embodiments regarding FIG. 5, step S340 conducted in the sensing period and comprises: receiving the second sub-current I_sub2 by the storage array 530 of the reading circuit 500; and in response to the second sub-current I_sub2 flowing through the storage array 530 and the at least one switching circuit, generating the output voltage Vout at the output terminal of the amplifier 122.

Figure 6:
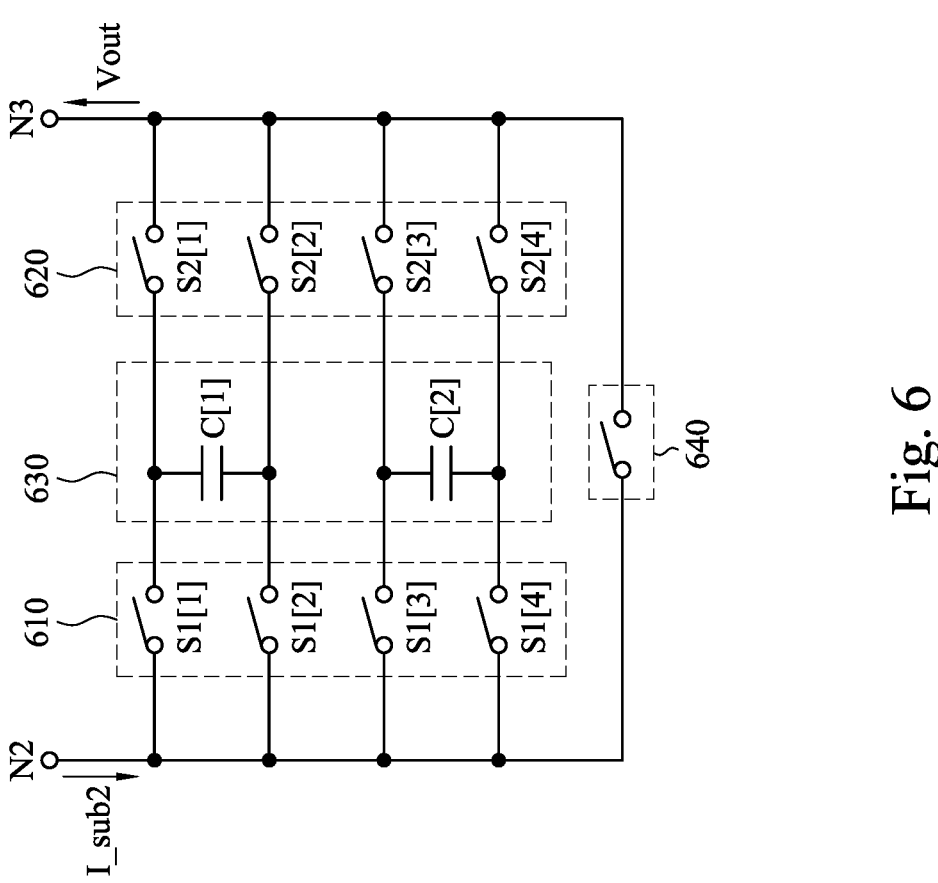
FIG. 6 is a schematic diagram of a reading circuit according to one embodiment of the present disclosure.

Reference is made to FIG. 6, in which FIG. 6 is a schematic diagram of a reading circuit 600 according to one embodiment of the present disclosure. The reading circuit

600 comprises a first switching circuit 610, a second switching circuit 620, and a storage array 630. The first switching circuit 610 comprises first switches S[1]-S[4] and is coupled between the second node N2 and the storage array 630. The second switch circuit comprises second switches S2[1]-S2[4] and is coupled between the third node N3 and the storage array 630. The storage array 630 comprises a first capacitor C[1] and a second capacitor C[2]. Two terminals of the first capacitor C[1] are coupled with the second node N2 (i.e., the second input terminal of the amplifier 122) through the first switches S[1] and S[2], respectively, and are coupled with the third node N3 (i.e., the output terminal of the amplifier 122) through the second switches S2[1] and S2[2], respectively. Two terminals of the second capacitor C[2] are coupled with the second node N2 (i.e., the second input terminal of the amplifier 122) through the first switches S[3] and S[4], respectively, and are coupled with the third node N3 (i.e., the output terminal of the amplifier 122) through the second switches S2[3] and S2[4], respectively.

Figure 7:
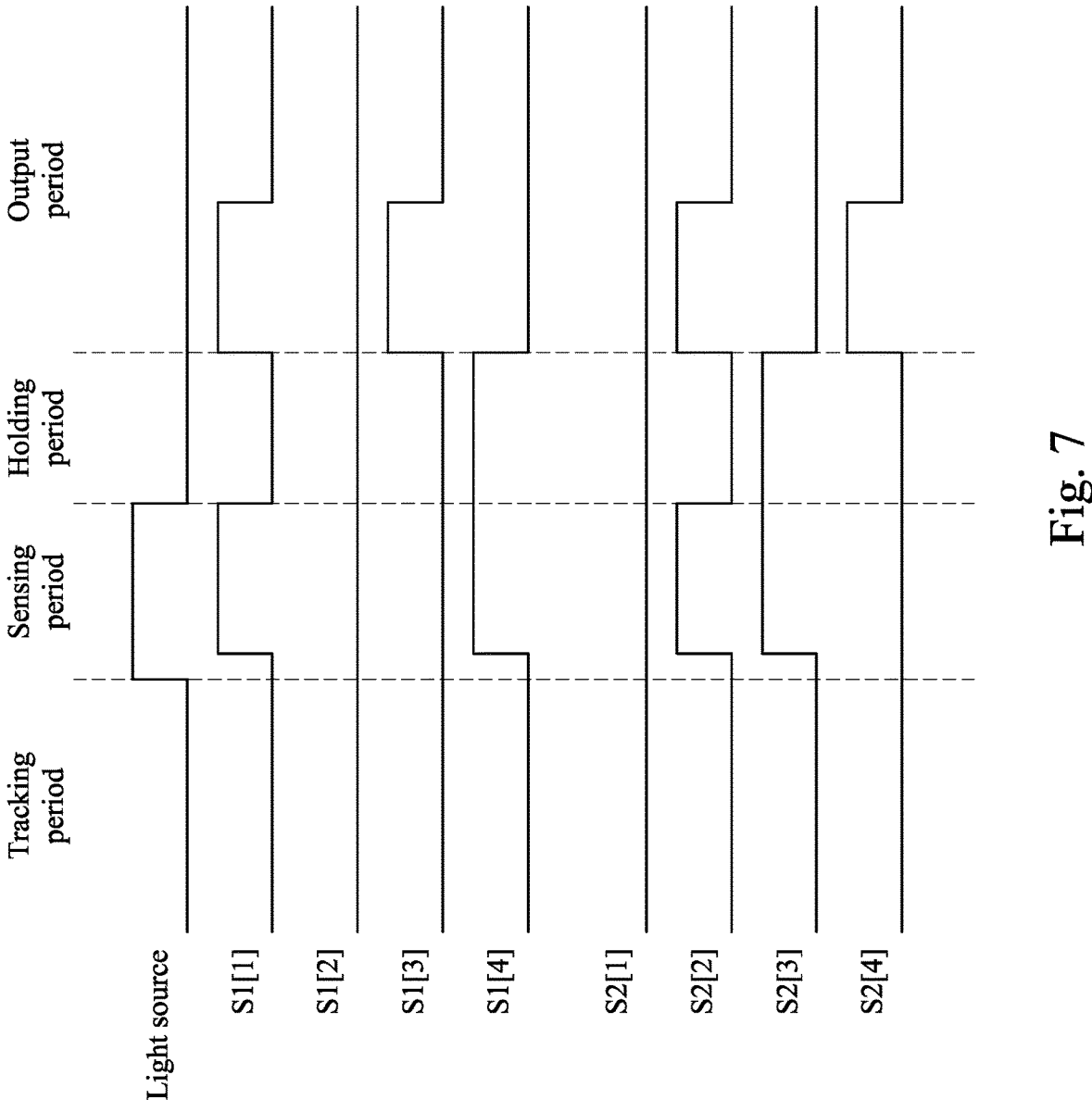
FIG. 7 is a waveform schematic diagram of the reading circuit according to one embodiment of the present disclosure.
Figure 8:
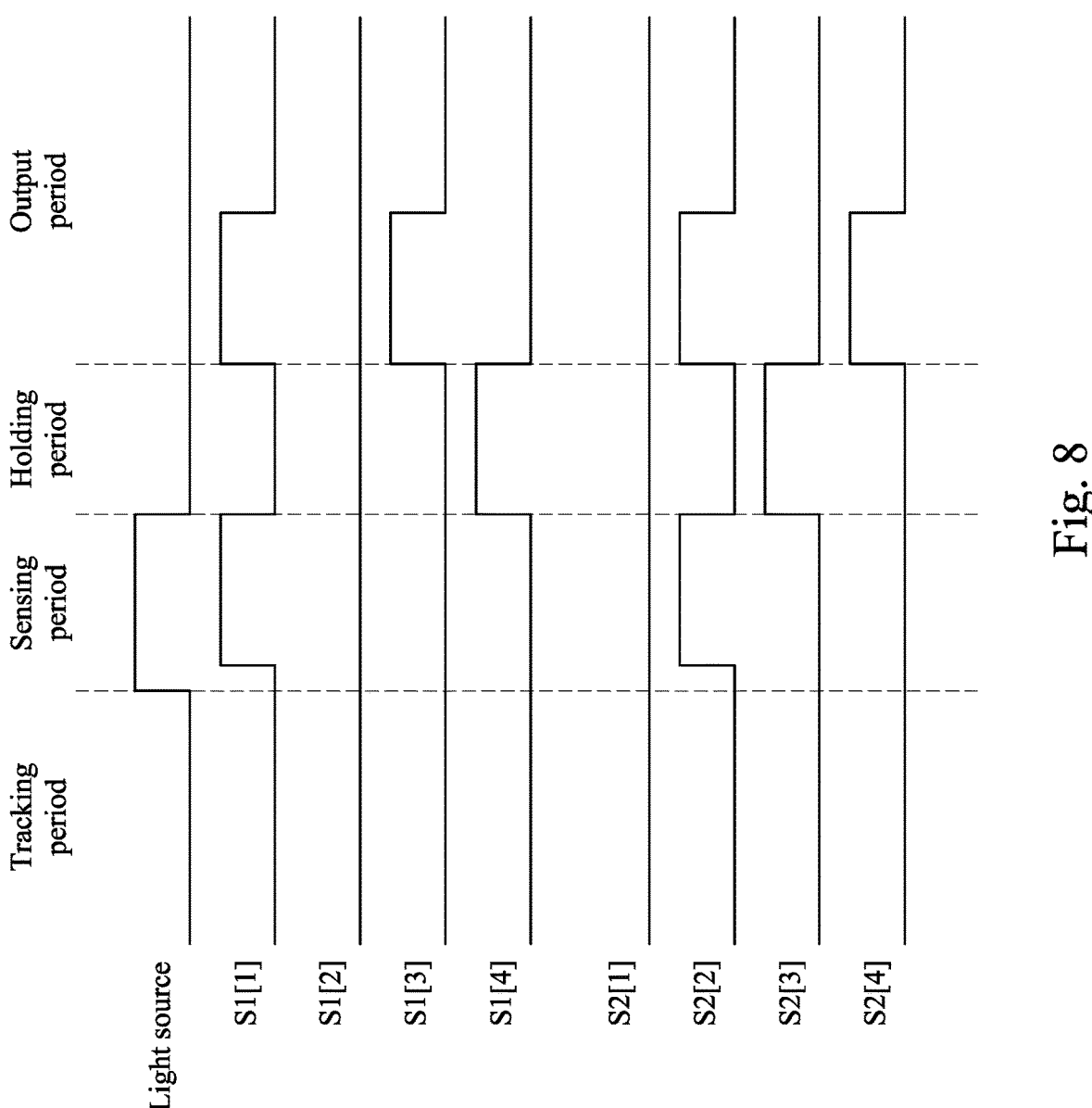
FIG. 8 is a waveform schematic diagram of the reading circuit according to one embodiment of the present disclosure.

Reference is made to FIG. 6, FIG. 7 and FIG. 8, in which FIGS. 7 and 8 are waveform schematic diagrams of the reading circuit 600 according to some embodiments of the present disclosure. In FIGS. 7 and 8, a high level of the waveform represents that the corresponding component is conducted or enabled, and a low level of the waveform represents that the corresponding component is switched off or disabled. The embodiment of FIG. 7 is discussed first. In the sensing period of FIG. 7, the light source of the PPG is enabled, and the first switching circuit 610 and the second switching circuit 620 form a first circuit topology to transmit the second sub-current I_sub2 to the first capacitor C[1] and the second capacitor C[2]. In addition, the first circuit topology configures the first capacitor C[1] and the second capacitor C[2] to be coupled in parallel between the second node N2 (i.e., the second input terminal of the amplifier 122) and the third node N3 (i.e., the output terminal of the amplifier 122). In one embodiment, the first circuit topology may be realized by conducting the first switches S1[1] and S1[4] and the second switches S2[2] and S2[3] and switching off the other switches. As a result, the ambient AC component Iac_amb and the reflected AC component Iac_rfl are stored in both the first capacitor C[1] and the second capacitor C[2].

In a holding period after the sensing period of FIG. 7 (i.e., after the first circuit topology is formed), the light source of the PPG is disabled, and the first switching circuit 610 and the second switching circuit 620 form a second circuit topology to transmit the second sub-current I_sub2 to the second capacitor C[2]. In one embodiment, the second circuit topology may be realized by conducting the first switch S1[4] and the second switch S2[3] and switching off the other switches. In some embodiments, the second switch S2[2] may remain conducted in the holding period. As a result, the information stored in the second capacitor C[2] is updated to including only the ambient AC component Iac_amb.

In an output period after the holding period of FIG. 7 (i.e., after the second circuit topology is formed), the first switching circuit 610 and the second switching circuit 620 form a third circuit topology to conduct charge sharing between the first capacitor C[1] and the second capacitor C[2] to cancel the ambient AC component Iac_amb stored in the first capacitor C[1]. In specific, a positive terminal (e.g., the first terminal) and a negative terminal (e.g., the second terminal) of the first capacitor C[1] are respectively coupled to a negative terminal (e.g., the first terminal) and a positive terminal (e.g., the second terminal) of the second capacitor C[2]. In some embodiments, the third circuit topology may be realized by conducting the first switches S1[1] and S1[3] and the second switches S2[2] and S2[4] and switching off the other switches. As a result, the output voltage Vout is generated in the output period and comprises only the reflected AC component Iac_rfl representing the heart rate, the blood oxygen saturation, etc. It will be understood that the number of capacitors of the storage array 630 is not intended to limit the scope of the present disclosure but is instead provided as an exemplary embodiment, where the storage array 630 may comprise more than two capacitors for performing the charging sharing to cancel the ambient AC component Iac_amb.

Reference is made to FIG. 8, in the sensing period of FIG. 8, the first switching circuit 610 and the second switching circuit 620 form a different first circuit topology to transmit the second sub-current I_sub2 to the first capacitor C[1] but not to the second capacitor C[2]. Other operation periods of FIG. 8 are respectively similar to the corresponding periods discussed with reference to FIG. 7, and therefore the detailed descriptions thereof are omitted here.

Accordingly, step S340 regarding the embodiments of FIG. 6 and FIG. 7 is conducted in the sending period through the output period and comprises: in the sensing period, controlling the first switching circuit 610 and the second switching circuit 620 of the reading circuit 130 to form the first circuit topology, in order to transmit the second sub-current I_sub2 to the first capacitor C[1] and the second capacitor C[2] of the reading circuit 130 and to configure the first capacitor C[1] and the second capacitor C[2] to be coupled in parallel between the second input terminal of the amplifier 122 and the output terminal of the amplifier 122; after the first circuit topology is formed, controlling the first switching circuit 610 and the second switching circuit 620 to form the second circuit topology to transmit the second sub-current I_sub2 to the second capacitor C[2]; and after the second circuit topology is formed, controlling the first switching circuit 610 and the second switching circuit 620 to form the third circuit topology to conduct charge sharing between the first capacitor C[1] and the second capacitor C[2].

In addition, step S340 regarding the embodiments of FIG. 6 and FIG. 8 is conducted in the sending period through the output period and comprises: in the sensing period, controlling the first switching circuit 610 and the second switching circuit 620 of the reading circuit 130 to form the first circuit topology, in order to transmit the second sub-current I_sub2 to the first capacitor C[1] of the reading circuit 130; after the first circuit topology is formed, controlling the first switching circuit 610 and the second switching circuit 620 to form the second circuit topology to transmit the second sub-current I_sub2 to the second capacitor C[2]; and after the second circuit topology is formed, controlling the first switching circuit 610 and the second switching circuit 620 to form the third circuit topology to conduct charge sharing between the first capacitor C[1] and the second capacitor C[2].

Figure 9:
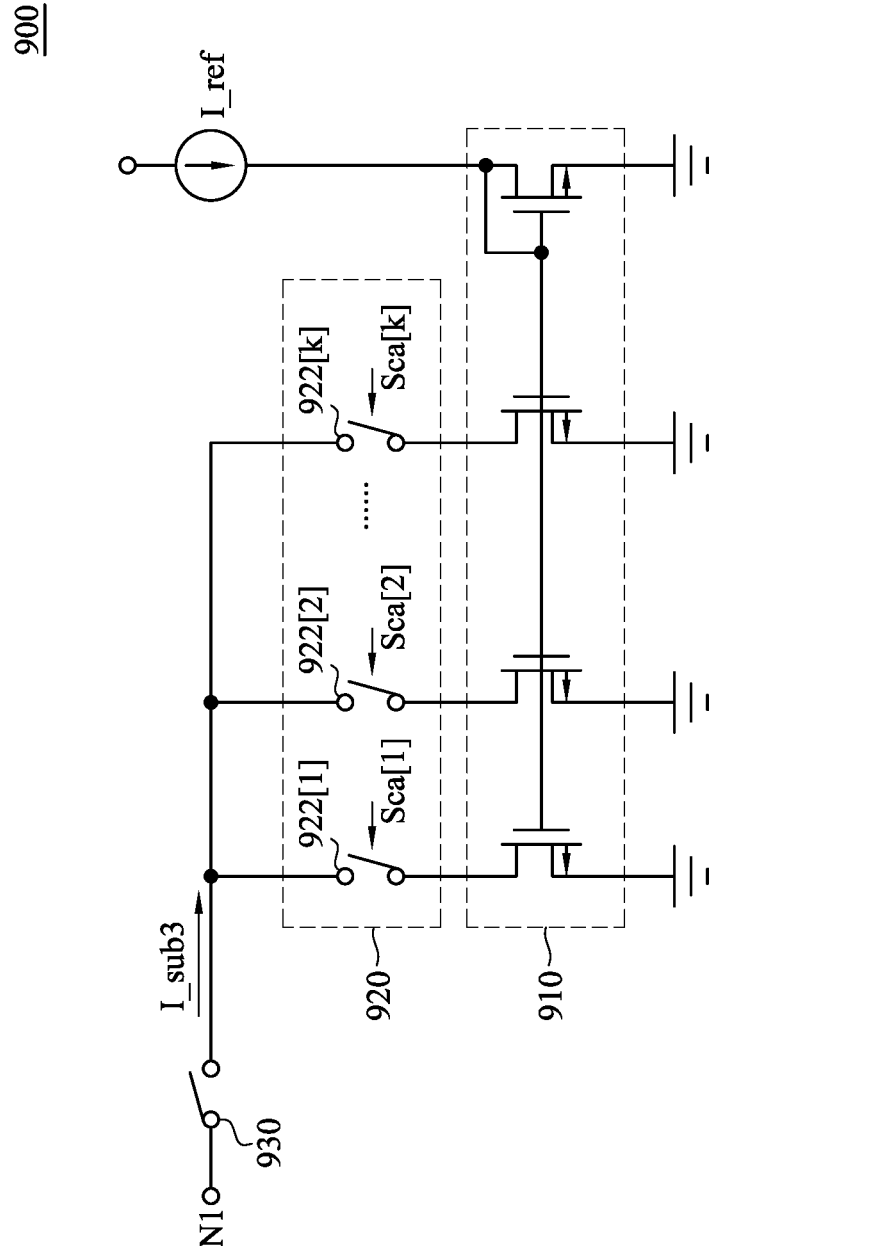
FIG. 9 is a schematic diagram of a second current control circuit according to one embodiment of the present disclosure.

The details of step S350 are described below. Reference is made to FIG. 9, in which FIG. 9 is a schematic diagram of a second current control circuit 900 according to one embodiment of the present disclosure. The second current control circuit 900 is coupled with the first node N1, and may be used to realize the second current control circuit 140 in FIG. 1. The second current control circuit 900 comprises a second current mirror 910, a switch array 920 and an enablement switch 930. The second current mirror 910 comprises an input terminal and at least one output terminal, where the input terminal of the second current mirror 910 is configured receive a reference current I_ref. The enablement switch 930 comprises a first terminal and a second terminal, where the first terminal of the enablement switch 930 is coupled with the first node to receive the third sub-current I_sub3. The enablement switch 930 is configured to be conducted in the sensing period.

The switch array 920 is coupled between the second terminal of the enablement switch 930 and the at least one output terminal of the second current mirror 910. In specific, the switch array 920 comprises at least one switch (e.g., switches 922[1]-922[k], in which k is a positive integer) which is respectively coupled with the at least one output terminal of the second current mirror 910. The switches 922[1]-922[k] are respectively controlled by bits Sca[1]-Sca[k] of a calibration signal. In some embodiments, the calibration signal is generated and adjusted by the DSP 103 of FIG. 1 in the current sensing period, according to magnitude of the second sub-current in a former sensing period.

In specific, when the third sub-current I_sub3 is different from the reflected DC component Idc_rfl, the second sub-current I_sub2 in the former sensing period includes part of the reflected DC component Idc_rfl which is not filtered out by the third sub-current I_sub3 (hereinafter referred to as a redundant DC component). The DSP 103 is configured to detect a magnitude of the redundant DC component from the output of the ADC, and configured to adjust the bits Sca[1]-Sca[k] according to the magnitude of the redundant DC component, so as to configure the third sub-current I_sub3 generated by the second current control circuit 900 to approach to the reflected DC component Idc_rfl.

Accordingly, step S350 comprises: determining, in the sensing period and by the second current control circuit 900 (or the second current control circuit 140 of FIG. 1), a magnitude of the third sub-current I_sub3 according to a magnitude of the second sub-current I_sub2 in the former sensing period, in which the third sub-current I_sub3 is part of the input current I_in.

It will be understood that the signal filtering method 300 discussed above may include greater or fewer operations than illustrated in the flowchart of FIG. 3 and the operations may be performed in any order, as appropriate. For example, steps S301 and S302 may be performed simultaneously. As another example, the steps S303, S304 and S305 may be performed simultaneously.

In some embodiments, the N-type and P-type transistors in FIG. 1, FIG. 4 and FIG. 9 may be replaced with the P-type and N-type transistors, respectively. In addition, the first operation voltage which is denoted by the ground symbol in FIG. 1 may be replaced with a high voltage, and the second operation voltage which is denoted by the high voltage in FIG. 1 may be replaced by a low voltage. In this situation, the input current I_in, the first sub-current I_sub1, the second sub-current I_sub2 and the third sub-current I_sub3 have directions respectively opposite to the directions thereof shown in FIG. 1.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means.

Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An analog frontend circuit for photoplethysmography, comprising:
   a first current control circuit, coupled with a first node, and configured to generate a first sub-current, wherein the first sub-current is part of an input current flowing to the first node;
   a monitoring circuit, coupled with the first node, and configured to receive a reference voltage, wherein in a tracking period, the monitoring circuit is configured to control the first current control circuit to determine a magnitude of the first sub-current, in order to control a voltage of the first node to track the reference voltage; and
   a reading circuit, coupled with the first node through the monitoring circuit,
   wherein in a sensing period after the tracking period, the monitoring circuit is configured to control the first current control circuit to keep the first sub-current to have the magnitude of the first sub-current determined in the tracking period,
   wherein after the first sub-current is kept, the monitoring circuit is configured to transmit a second sub-current from the first node to the reading circuit so that the reading circuit is configured to convert the second sub-current to an output voltage, wherein the second sub-current is part of the input current.

2. The analog frontend circuit of claim 1, wherein the monitoring circuit comprises:
   an amplifier, comprising a first input terminal, a second input terminal and an output terminal, wherein the second input terminal of the amplifier is coupled with the reading circuit;
   a sample-and-hold circuit, coupled with the output terminal of the amplifier and the first current control circuit, configured to sample an output of the amplifier, wherein the sample-and-hold circuit is configured to output the sampled output of the amplifier to control the first current control circuit to determine the magnitude of the first sub-current; and a switch array, coupled with the first node, the first input terminal and the second input terminal of the amplifier, configured to receive the reference voltage, wherein in the tracking period, the switch array is configure to respectively provide the second sub-current and the reference voltage to the first input terminal and the second input terminal of the amplifier, and wherein in the sensing period, the switch array is configure to respectively provide the second sub-current and the reference voltage to the second input terminal and the first input terminal of the amplifier.

3. The analog frontend circuit of claim 2, wherein the sample-and-hold circuit comprises:
   a sampling capacitor, comprising a first terminal and a second terminal, wherein the first terminal of the sampling capacitor is coupled with the first current control circuit, and the second terminal of the sampling capacitor is configured to receive a first operation voltage; and
   a sampling switch, coupled between the output terminal of the amplifier and the first terminal of the sampling capacitor, wherein the sampling switch is conducted in the tracking period and is switched off in the sensing period.

4. The analog frontend circuit of claim 2, wherein the reading circuit comprises:
   at least one switching circuit, configured to be switched off in the tracking period and conducted in the sensing period; and
   a storage array, comprising at least one resistor coupled in parallel, and coupled with the at least one switching circuit,
   wherein the at least one switching circuit and the storage array are coupled between the second input terminal of the amplifier and the output terminal of the amplifier.

5. The analog frontend circuit of claim 2, wherein the reading circuit comprises:
   a first switching circuit;
   a second switching circuit;
   a first capacitor; and
   a second capacitor,
   wherein two terminals of the first capacitor and two terminals of the second capacitor are coupled with the second input terminal of the amplifier through the first switching circuit, and the two terminals of the first capacitor and the two terminals of the second capacitor are coupled with the output terminal of the amplifier through the second switching circuit,
   wherein in the sensing period, the first switching circuit and the second switching circuit form a first circuit topology to transmit the second sub-current to the first capacitor and the second capacitor and to configure the first capacitor and the second capacitor to be coupled in parallel between the second input terminal of the amplifier and the output terminal of the amplifier,
   wherein after the first circuit topology is formed, the first switching circuit and the second switching circuit form a second circuit topology to transmit the second sub-current to the second capacitor,
   wherein after the second circuit topology is formed, the first switching circuit and the second switching circuit form a third circuit topology to conduct charge sharing between the first capacitor and the second capacitor.

6. The analog frontend circuit of claim 2, wherein the reading circuit comprises:
   a first switching circuit;
   a second switching circuit;
   a first capacitor; and a second capacitor, wherein two terminals of the first capacitor and two terminals of the second capacitor are coupled with the second input terminal of the amplifier through the first switching circuit, and the two terminals of the first capacitor and the two terminals of the second capacitor are coupled with the output terminal of the amplifier through the second switching circuit, wherein in the sensing period, the first switching circuit and the second switching circuit form a first circuit topology to transmit the second sub-current to the first capacitor, wherein after the first circuit topology is formed, the first switching circuit and the second switching circuit form a second circuit topology to transmit the second sub-current to the second capacitor, wherein after the second circuit topology is formed, the first switching circuit and the second switching circuit form a third circuit topology to conduct charge sharing between the first capacitor and the second capacitor.

7. The analog frontend circuit of claim 1, wherein the first current control circuit comprises:

a transistor, comprising a first terminal, a second terminal and a control terminal, wherein the first sub-current flows through the transistor, wherein the first terminal of the transistor is coupled with the first node, the second terminal of the transistor is configured to receive a first operation voltage, and the control terminal of the transistor is coupled with the monitoring circuit to receive a control signal generated by the monitoring circuit according to the voltage of the first node and the reference voltage.

8. The analog frontend circuit of claim 1, wherein the first current control circuit comprises:

a transistor, comprising a first terminal, a second terminal and a control terminal, wherein the first terminal of the transistor is configured to receive a second operation voltage, and the control terminal of the transistor is coupled with the monitoring circuit to receive a control signal generated by the monitoring circuit according to the voltage of the first node and the reference voltage; and a first current mirror, comprising an input terminal and an output terminal, wherein the input terminal of the first current mirror is coupled with the second terminal of the transistor, and the output terminal of the first current mirror is coupled with the first node, wherein the first sub-current flows through the output terminal of the first current mirror.

9. The analog frontend circuit of claim 1, further comprising:

a second current control circuit, coupled with the first node, and configured to generate a third sub-current in the sensing period, wherein the third sub-current is part of the input current, wherein the second current control circuit is configured to determine a magnitude of the third sub-current according to a magnitude of the second sub-current in a former sensing period.

10. The analog frontend circuit of claim 9, wherein the second current control circuit comprises:

a second current mirror, comprising an input terminal and at least one output terminal, wherein the input terminal of the second current mirror is configured to receive a reference current;

an enablement switch, comprising a first terminal and a second terminal, and configured to be conducted in the sensing period, wherein the first terminal of the enablement switch is coupled with the first node; and a switch array, coupled between the second terminal of the enablement switch and the at least one output terminal of the second current mirror, and controlled by a calibration signal related to the magnitude of the second sub-current in the former sensing period.

11. A signal filtering method for photoplethysmography, comprising:

monitoring, in a tracking period and by a monitoring circuit, a voltage of a first node and a reference voltage, wherein an input current flows to the first node;

controlling, in the tracking period and by the monitoring circuit, a first current control circuit coupled to the first node to determine a magnitude of a first sub-current, wherein the first sub-current is part of the input current and generated by the first current control circuit;

in a sensing period after the tracking period, controlling, by the monitoring circuit, the first current control circuit to keep the first sub-current to have the magnitude of the first sub-current determined in the tracking period; and after the first sub-current is kept, converting, by a reading circuit coupled with the first node through the monitoring circuit, a second sub-current transmitted from the first node through the monitoring circuit to the reading circuit to an output voltage, wherein the second sub-current is part of the input current.

12. The signal filtering method of claim 11, wherein monitoring the voltage of the first node and the reference voltage comprises:

receiving the second sub-current and the reference voltage by a switch array of the monitoring circuit; and transmitting the second sub-current and the reference voltage respectively to a first input terminal and a second input terminal of an amplifier of the monitoring circuit, wherein the second input terminal of the amplifier is coupled with the reading circuit.

13. The signal filtering method of claim 12, wherein controlling the first current control circuit to determine the magnitude of the first sub-current comprises:

sampling an output of the amplifier by a sample-and-hold circuit coupled with an output terminal of the amplifier and the first current control circuit; and outputting, by the sample-and-hold circuit, the sampled output of the amplifier to the first current control circuit, so as to control the first current control circuit to determine the magnitude of the first sub-current.

14. The signal filtering method of claim 13, wherein controlling the first current control circuit to keep the first sub-current to have the magnitude of the first sub-current determined in the tracking period comprises:

switching off a sampling switch of the sample-and-hold circuit in the sensing period, wherein the sampling switch is coupled between the output terminal of the amplifier and a first terminal of a sampling capacitor of the sample-and-hold circuit, and is conducted in the tracking period; and outputting the sampled output of the amplifier, in the sensing period and by the first terminal of the sampling capacitor of the sample-and-hold circuit, to the first current control circuit to control the first current control circuit to keep the first sub-current to have the magnitude of the first sub-current determined in the tracking period.

15. The signal filtering method of claim 12, wherein converting the second sub-current to the output voltage comprises:

receiving the second sub-current by a storage array of the reading circuit, wherein the reading circuit further comprises at least one switching circuit, and the storage array comprises at least one resistor, wherein the at least one switching circuit is configured to be switched off in the tracking period and conducted in the sensing period, wherein the storage array and the at least one switching circuit are coupled between the second input terminal of the amplifier and an output terminal of the amplifier; and in response to the second sub-current flowing through the storage array and the at least one switching circuit, generating the output voltage at the output terminal of the amplifier.

16. The signal filtering method of claim 12, wherein converting the second sub-current to the output voltage comprises:

in the sensing period, controlling a first switching circuit and a second switching circuit of the reading circuit to form a first circuit topology, in order to transmit the second sub-current to a first capacitor and a second capacitor of the reading circuit and to configure the first capacitor and the second capacitor to be coupled in parallel between the second input terminal of the amplifier and an output terminal of the amplifier, wherein two terminals of the first capacitor and two terminals of the second capacitor are coupled with the second input terminal of the amplifier through the first switching circuit, and the two terminals of the first capacitor and the two terminals of the second capacitor are coupled with the output terminal of the amplifier through the second switching circuit;

after the first circuit topology is formed, controlling the first switching circuit and the second switching circuit to form a second circuit topology to transmit the second sub-current to the second capacitor; and after the second circuit topology is formed, controlling the first switching circuit and the second switching circuit to form a third circuit topology to conduct charge sharing between the first capacitor and the second capacitor.

17. The signal filtering method of claim 12, wherein converting the second sub-current to the output voltage comprises:

in the sensing period, controlling a first switching circuit and a second switching circuit of the reading circuit to form a first circuit topology, in order to transmit the second sub-current to a first capacitor of the reading circuit, wherein two terminals of the first capacitor are coupled with the second input terminal of the amplifier through the first switching circuit, and the two terminals of the first capacitor are coupled with an output terminal of the amplifier through the second switching circuit;

after the first circuit topology is formed, controlling the first switching circuit and the second switching circuit to form a second circuit topology to transmit the second sub-current to a second capacitor of the reading circuit, wherein two terminals of the second capacitor are coupled with the second input terminal of the amplifier through the first switching circuit, and the two terminals of the second capacitor are coupled with the output terminal of the amplifier through the second switching circuit; and after the second circuit topology is formed, controlling the first switching circuit and the second switching circuit to form a third circuit topology to conduct charge sharing between the first capacitor and the second capacitor.

18. The signal filtering method of claim 11, wherein controlling the first current control circuit to determine the magnitude of the first sub-current comprises:

generating a control signal by the monitoring circuit according to the voltage of the first node and the reference voltage; and using a transistor of the first current control circuit to determine the magnitude of the first sub-current according to the control signal, wherein the first sub-current flows through the transistor, wherein a first terminal of the transistor is coupled with the first node, a second terminal of the transistor is configured to receive a first operation voltage, and a control terminal of the transistor is coupled with the monitoring circuit to receive the control signal.

19. The signal filtering method of claim 11, wherein controlling the first current control circuit to determine the magnitude of the first sub-current comprises:

generating a control signal by the monitoring circuit according to the voltage of the first node and the reference voltage;

receiving the control signal by a control terminal of a transistor of the first current control circuit, wherein a first terminal of the transistor is configured to receive a second operation voltage; and using a first current mirror of the first current control circuit to determine the magnitude of the first sub-current, wherein an input terminal of the first current mirror is coupled with a second terminal of the transistor, and an output terminal of the first current mirror is coupled with the first node, wherein the first sub-current flows through the output terminal of the first current mirror.

20. The signal filtering method of claim 11, further comprising:

determining, in the sensing period and by a second current control circuit coupled with the first node, magnitude of a third sub-current according to magnitude of the second sub-current in a former sensing period, wherein the third sub-current is generated by the second current control circuit and is part of the input current.

\*   \*   \*   \*   \*